United States Patent
Kando

(10) Patent No.: US 7,453,184 B2
(45) Date of Patent: Nov. 18, 2008

(54) BOUNDARY ACOUSTIC WAVE DEVICE

(75) Inventor: Hajime Kando, Kyoto-fu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 401 days.

(21) Appl. No.: 10/549,888

(22) PCT Filed: Jan. 28, 2004

(86) PCT No.: PCT/JP2004/000762

§ 371 (c)(1),
(2), (4) Date: Sep. 16, 2005

(87) PCT Pub. No.: WO2004/095699

PCT Pub. Date: Nov. 4, 2004

(65) Prior Publication Data

US 2006/0175928 A1  Aug. 10, 2006

(30) Foreign Application Priority Data

Apr. 18, 2003  (JP)  ............................. 2003-114592

(51) Int. Cl.
*H03H 9/45*  (2006.01)
(52) U.S. Cl. .......................... 310/313 R; 310/313 B; 333/189; 333/195
(58) Field of Classification Search ............ 310/313 A, 310/313 B, 313 C, 313 D, 313 R; 333/189–195
See application file for complete search history.

(56) References Cited

U.S. PATENT DOCUMENTS

| 4,037,176 A | * | 7/1977 | Ono et al. | ............... | 310/313 B |
| 4,388,600 A | * | 6/1983 | Wakino et al. | .......... | 310/313 R |
| 4,484,098 A | * | 11/1984 | Cullen et al. | ............ | 310/313 A |
| 5,777,422 A | * | 7/1998 | Kitabayashi et al. | ..... | 310/313 A |
| 5,838,090 A | * | 11/1998 | Nakahata et al. | ........ | 310/313 A |
| 6,025,636 A | * | 2/2000 | Nakahata et al. | ........ | 310/313 A |
| 6,046,656 A | | 4/2000 | Mishima | | |
| 6,236,141 B1 | * | 5/2001 | Sato et al. | ............... | 310/313 R |
| 2003/0011281 A1 | * | 1/2003 | Itakura et al. | ........... | 310/313 R |

FOREIGN PATENT DOCUMENTS

| JP | 62-48011 | 3/1987 |
| JP | 03-046233 U | 9/1989 |
| JP | 01-137624 U | 4/1991 |

(Continued)

OTHER PUBLICATIONS

Yumanouchi et al., "Piezoelectric Acoustic Boundary Waves Propagating Along the Interface Between $SiO_2$ and $LiTaO_3$," IEEE Transactions on Sonics and Ultrasonics, Nov. 1978, pp. 384-389, vol. SU-25, No. 6.

(Continued)

*Primary Examiner*—J. A San Martin
(74) *Attorney, Agent, or Firm*—Keating & Bennett, LLP

(57) ABSTRACT

A boundary acoustic wave device includes a $LiNbO_3$ substrate defining a first medium layer having a relatively high sound velocity and a $SiO_2$ film defining a second medium layer having a relatively low sound velocity, an electroacoustic transducer and reflectors disposed between the first medium layer and the second medium layer, and recess portions and/or protrusion portions provided in the upper surface of the $SiO_2$ film.

19 Claims, 9 Drawing Sheets

FOREIGN PATENT DOCUMENTS

| | | |
|---|---|---|
| JP | 07-212174 | 8/1995 |
| JP | 10-084246 | 3/1998 |
| JP | 10-335974 | 12/1998 |
| WO | WO 98/51011 | 11/1998 |
| WO | WO 98/52279 | 11/1998 |

OTHER PUBLICATIONS

Takashi et al., "Highly Piezoelectric Boundary Waves in Si/SiO$_2$/LiNbO$_3$ Structure," 26$^{th}$ EM symposium, May 1997, pp. 53-58.

Official communication issued in the counterpart German Application No. 112004000499.3, mailed on Sep. 11, 2007.

Irino et al.; "Optimized Stoneley Wave Device by Proper Choice of Glass Overcoat," IEEE Transactions on Ultrasonics, Ferroelectrics, and Frequency Control; vol. 36, No. 2; Mar. 1989; pp. 159-167.

Official Communication dated May 18, 2004, issued in the corresponding International Patent Application No. PCT/JP2004/000762.

* cited by examiner

BOUNDARY ACOUSTIC WAVE DEVICE

BACKGROUND OF THE INVENTION

1. Field of the Invention

The present invention relates to a boundary acoustic wave device utilizing a boundary acoustic wave which propagates along a boundary between a first medium layer and a second medium layer having a different sound velocity from the first medium layer, and more particularly, to a boundary acoustic wave device which suppresses unwanted spurious signals.

2. Description of the Related Art

In surface acoustic wave devices utilizing a surface acoustic wave, such as a Rayleigh wave or a first leakage wave, reduced size and weight can be achieved, and in addition, adjustment is not required.

Thus, surface acoustic wave devices have been widely used for RF or IF filters in, for example, mobile phones, VCO resonators, and VIF filters for televisions.

However, since surface acoustic waves propagate along a surface of a medium, surface acoustic waves are sensitive to changes in the surface condition of the medium. Accordingly, in a chip in which surface acoustic waves propagates, a chip surface along which a surface acoustic wave propagates must be protected. Thus, a surface acoustic wave device must be hermetically sealed using a package having a cavity portion therein, such that the chip surface of the surface acoustic wave chip faces the cavity portion. As a result, the cost of the package described above is relatively high. In addition, the size of the package must be larger than the size of the surface acoustic wave chip.

A boundary acoustic wave device, which does not require the package having a cavity portion as described above, has been proposed.

FIG. 15 is a front cross-sectional view of a conventional boundary acoustic wave device. In a boundary acoustic wave device 101, a first medium layer 102 and a second medium layer 103 having different sound velocities are laminated to each other. At a boundary A between the first medium layer 102 and the second medium layer 103, an IDT 104 defining an electroacoustic transducer is disposed. In addition, reflectors (not shown) are disposed at the two sides of the IDT 104 in the direction along which a boundary acoustic wave propagates.

In the boundary acoustic wave device 101, by applying an input signal to the IDT 104, a boundary acoustic wave is generated. The boundary acoustic wave propagates along the boundary A of the boundary acoustic wave device 101, as schematically shown by arrow B in FIG. 15.

In "Piezoelectric Acoustic Boundary Waves Propagating Along the Interface Between SiO$_2$ and LiTaO$_3$," IEEE Trans. Sonics and Ultrason., VOL. SU-25, No. 6, 1978 IEEE, one example of a boundary acoustic wave device as described above is disclosed. In this device, an IDT is formed on a 126° rotated Y plate X propagating LiTaO$_3$ substrate, and a SiO$_2$ film having a desired thickness is formed on the LiTaO$_3$ substrate so as to cover the IDT. In this structure, an SV+P type boundary acoustic wave (Stoneley wave) propagates. "Piezoelectric Acoustic Boundary Waves Propagating Along the Interface Between SiO$_2$ and LiTaO$_3$," IEEE Trans. Sonics and Ultrason., VOL. SU-25, No. 6, 1978 IEEE, discloses that when the thickness of the SiO$_2$ film is set to 1.0 λ (λ indicates the wavelength of a boundary acoustic wave), an electromechanical coefficient of 2% is obtained.

In addition, in "Highly Piezoelectric Boundary Acoustic Wave Propagating in Si/SiO$_2$/LiNbO$_3$ Structure" (26$^{th}$ EM symposium, May 1997, pp. 53 to 58), an SH type boundary acoustic wave propagates in a [001]—Si<110>/SiO$_2$/Y-cut X propagating LiNbO$_3$ structure. This SH type boundary acoustic wave has an advantage in that an electromechanical coefficient k$^2$ is increased as compared to that of the Stoneley wave. In addition, since the SH type boundary acoustic wave is an SH type wave, the reflection coefficient of electrode fingers defining an IDT reflector is increased as compared to that of the Stoneley wave. Thus, when a resonator or a resonator type filter utilizes the SH type boundary acoustic wave, greater miniaturization can be achieved. In addition, steeper frequency properties are obtained.

Since the boundary acoustic wave devices utilize boundary acoustic waves, which are disclosed in "Piezoelectric Acoustic Boundary Waves Propagating Along the Interface Between SiO$_2$ and LiTaO$_3$," IEEE Trans. Sonics and ultrason., VOL. SU-25, No. 6, 1978 IEEE and "Highly Piezoelectric Boundary Acoustic Wave Propagating in Si/SiO$_2$/LiNbO$_3$ Structure" (26$^{th}$ EM symposium, May 1997, pp. 53 to 58), a package including a cavity portion is not required. Therefore, the size and cost of the acoustic wave device are reduced. However, the inventors of the present invention have discovered that, when the boundary acoustic wave device is actually produced, unwanted spurious signals are often generated.

FIGS. 16 and 17 are views illustrating a problem with a conventional boundary acoustic wave device. FIG. 16 is a schematic perspective view showing the appearance of the boundary acoustic wave device 111, and FIG. 17 is a view showing the frequency properties thereof.

As shown in FIG. 16, on a Y-cut X propagating single crystal LiNbO$_3$ substrate 112, an IDT 113 and reflectors 114 and 115 are formed using an Au film having a thickness of about 6.05 λ. In addition, on the single crystal LiNbO$_3$ substrate 112, a SiO$_2$ film 116 having a thickness of about 3.3 λ is formed by RF magnetron sputtering at a wafer heating temperature of about 200° C. so as to cover the IDT 113 and the reflectors 114 and 115. The number of electrode finger pairs of the IDT 113, the cross width, and the duty ratio of the electrode finger are set to 50 pairs, about 30 λ and about 0.6, respectively. In addition, the number of electrode fingers of the reflectors 114 and 115 are each set to 50, and the wavelength λ of the reflectors 114 and 115 is set to be substantially the same as the wavelength λ of the IDT 113. In addition, the distances between the center of the electrode finger of the IDT 113 and that of the reflectors 114 and 115 are each set to about 0.5 λ. On the upper and the lower sides of the Au film, thin Ti layers are formed by deposition in order to enhance the adhesion.

The frequency properties of a boundary acoustic wave device 111 formed as described above are shown in FIG. 17. As shown in FIG. 17, in the boundary acoustic wave device 111, spurious signals are generated at a higher frequency side which have greater intensities than the spurious signals generated at an anti-resonance frequency and the vicinity thereof.

Accordingly, when the boundary acoustic wave device 111 is used as a resonator, unnecessary resonance is generated by the spurious signals described above. In addition, when the boundary acoustic wave device 111 is used as a filter, the out-of-band suppression level is degraded thereby. Therefore, the spurious signals significantly interfere with the production of practical boundary acoustic wave devices.

SUMMARY OF THE INVENTION

To overcome the problems described above, preferred embodiments of the present invention provide a boundary acoustic wave device which effectively suppresses unwanted spurious signals and which provides superior frequency properties.

In accordance with a first preferred embodiment of the present invention, a boundary acoustic wave device utilizes a boundary acoustic wave that propagates along a boundary between a first medium layer and a second medium layer, in which the sound velocity of the second medium layer is less than that of the first medium layer, and when the wavelength of the boundary acoustic wave is represented by $\lambda$, the thickness of the second medium layer is preferably at least about 7 $\lambda$. That is, according to the first preferred embodiment of the present invention, since the second medium layer having a relatively low sound velocity has a specific thickness, unwanted spurious signals are effectively: suppressed.

In accordance with a second preferred embodiment of the present invention, a boundary acoustic wave device is provided which utilizes a boundary acoustic wave that propagates along a boundary surface between a first medium layer and a second medium layer, in which a structure for scattering an acoustic wave is provided on at least one surface of the first and/or the second medium layer at the side opposite to the boundary surface therebetween.

In the second preferred embodiment of the present invention, since the structure for scattering an acoustic wave is provided, unwanted spurious signals are suppressed.

According to one specific example of the second preferred embodiment of the present invention, the sound velocity of the second medium layer is less than that of the first medium layer, and the structure for scattering an acoustic wave is provided for the second medium layer.

According to another specific example of the second preferred embodiment of the present invention, the structure for scattering an acoustic wave includes at least one recess portion and/or at least one protrusion portion provided on at least one surface of the first and second medium layers at the side opposite to the boundary surface.

According to another specific example of the second preferred embodiment of the present invention, when the wavelength of the boundary acoustic wave is represented by $\lambda$, the depth of the recess portion or the height of the protrusion portion is at least about $0.05\lambda$.

According to another specific example of the second preferred embodiment of the present invention, when the wavelength of the boundary acoustic wave is represented by $\lambda$, the pitch between the recess portions and/or the pitch between the protrusion portions is at least about $1\lambda$.

According to another specific example of the second preferred embodiment of the present invention, when the wavelength of the boundary acoustic wave is represented by $\lambda$, the thickness of the medium layer on which the structure for scattering an acoustic wave is provided is about $7\lambda$ or less, the thickness of the medium layer being defined by the distance between the boundary surface and the surface opposite thereto. That is, when the thickness of the second medium layer having a low sound velocity is less than about $7\lambda$, it is difficult to suppress the spurious signals. However, when the structure for scattering an acoustic wave is provided, the spurious signals are suppressed.

According to another specific example of the second preferred embodiment of the present invention, the second medium layer is made of $SiO_2$, the first medium layer is made of a piezoelectric substrate containing Li, and at least one recess portion and/or at least one protrusion portion is provided on a surface of the second medium layer made of $SiO_2$.

According to a specific example of the first and second preferred embodiments of the present invention, an electroacoustic transducer for driving a boundary acoustic wave is provided between the first and the second medium layers.

According to another specific example of the first and second preferred embodiments of the present invention, at least one reflector is provided at the boundary between the first medium layer and the second medium layer.

According to another specific example of the second preferred embodiment of the present invention, an exterior layer material is provided on the surface of the medium layer on which at least one recess portion and/or at least one protrusion portion is provided.

Other features, elements, steps, advantages and characteristics of the present invention will become more apparent from the following detailed description of preferred embodiments thereof with reference to the attached drawings.

DETAILED DESCRIPTION OF PREFERRED EMBODIMENTS

Hereinafter, with reference to figures, particular preferred embodiments of the present invention will be described such that the present invention will be clearly understood.

Figure 16:
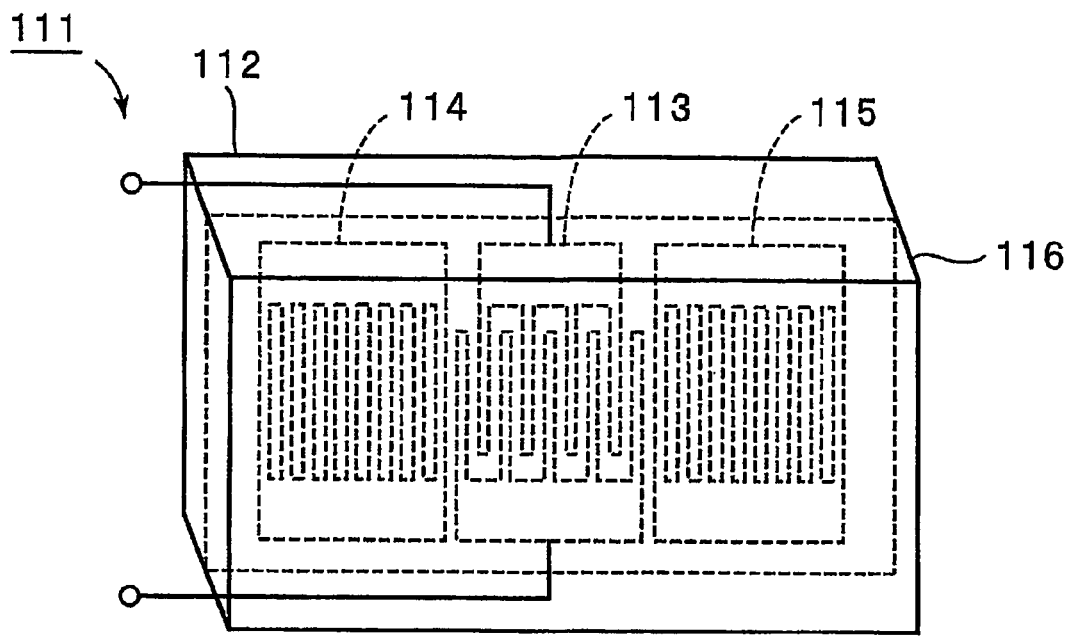
FIG. 16 is a schematic perspective view illustrating a conventional boundary acoustic wave device.
Figure 17:
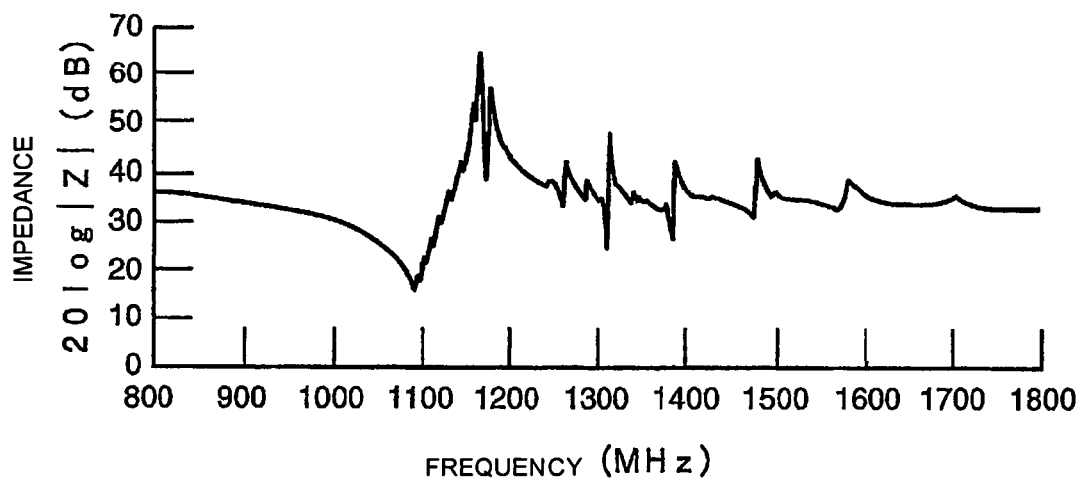
FIG. 17 is a view showing impedance properties of the boundary acoustic wave device shown in FIG. 16.

First, in order to investigate the causes of the spurious signals shown in FIG. 17, a numerical analysis of the boundary acoustic wave device 111 shown in FIG. 16 is performed, such that the displacement distribution of a boundary acoustic wave and the displacement distribution of a spurious mode are obtained. In this investigation, it is assumed that the displacement between a $SiO_2$ film and Au and that between the Au and a $LiNbO_3$ substrate are continuous and the stress in the vertical direction is continuous, the potential is 0 due to a short-circuiting boundary, the $SiO_2$ film has a predetermined thickness, and the $LiNbO_3$ has an infinite thickness.

Figure 2:
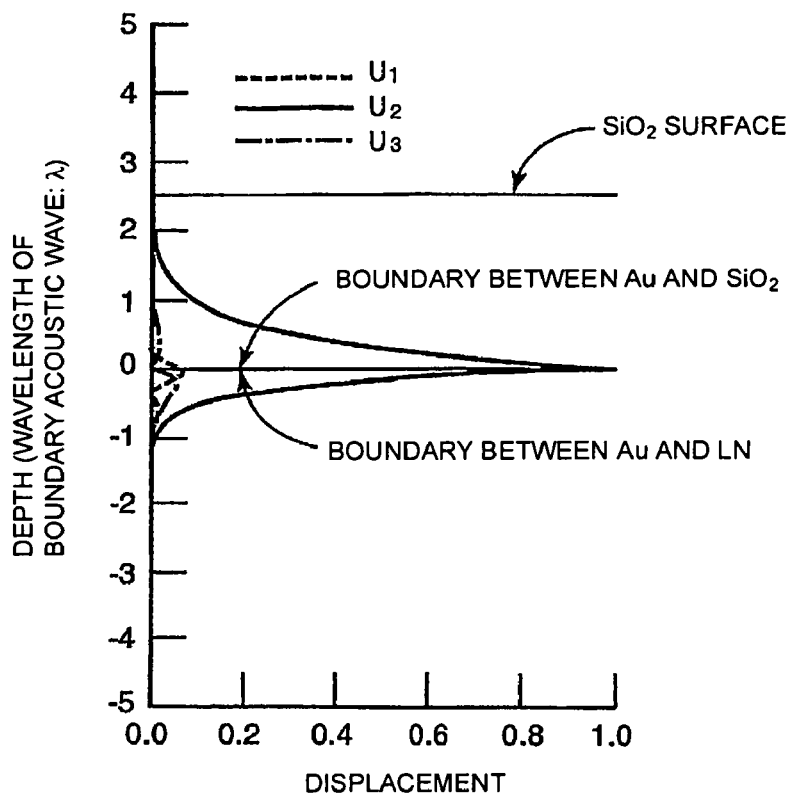
FIG. 2 is a graph showing a displacement distribution of a main mode of a boundary acoustic wave in conventional boundary acoustic wave devices shown in FIGS. 15 and 16.
Figure 3:
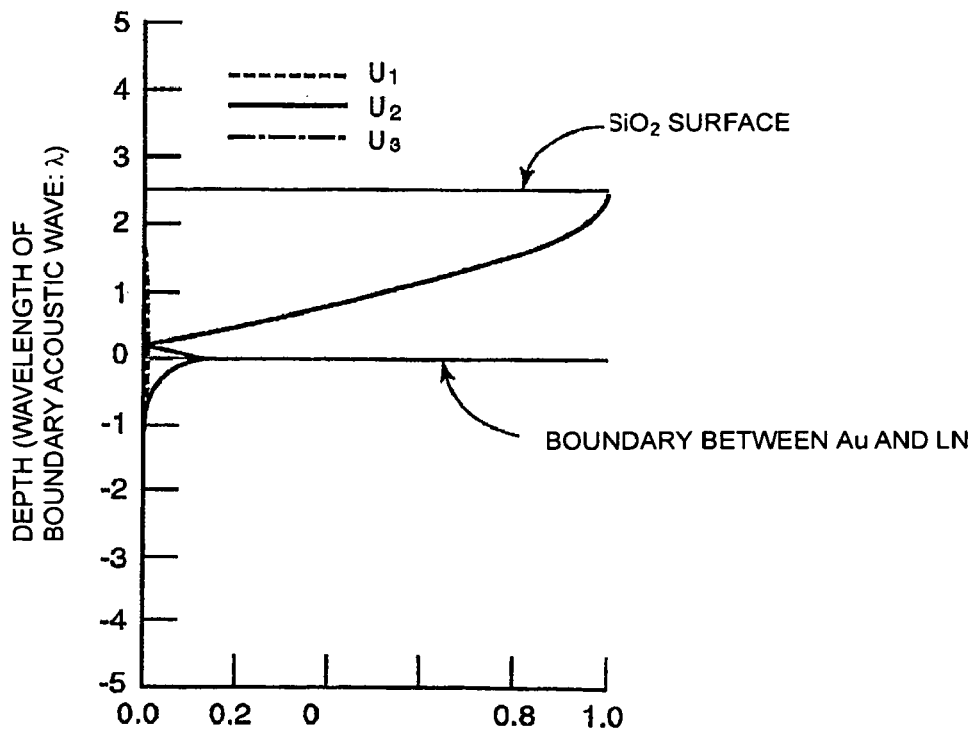
FIG. 3 is a graph showing one example of a displacement distribution of a spurious mode under the same conditions shown in FIG. 2.
Figure 4:
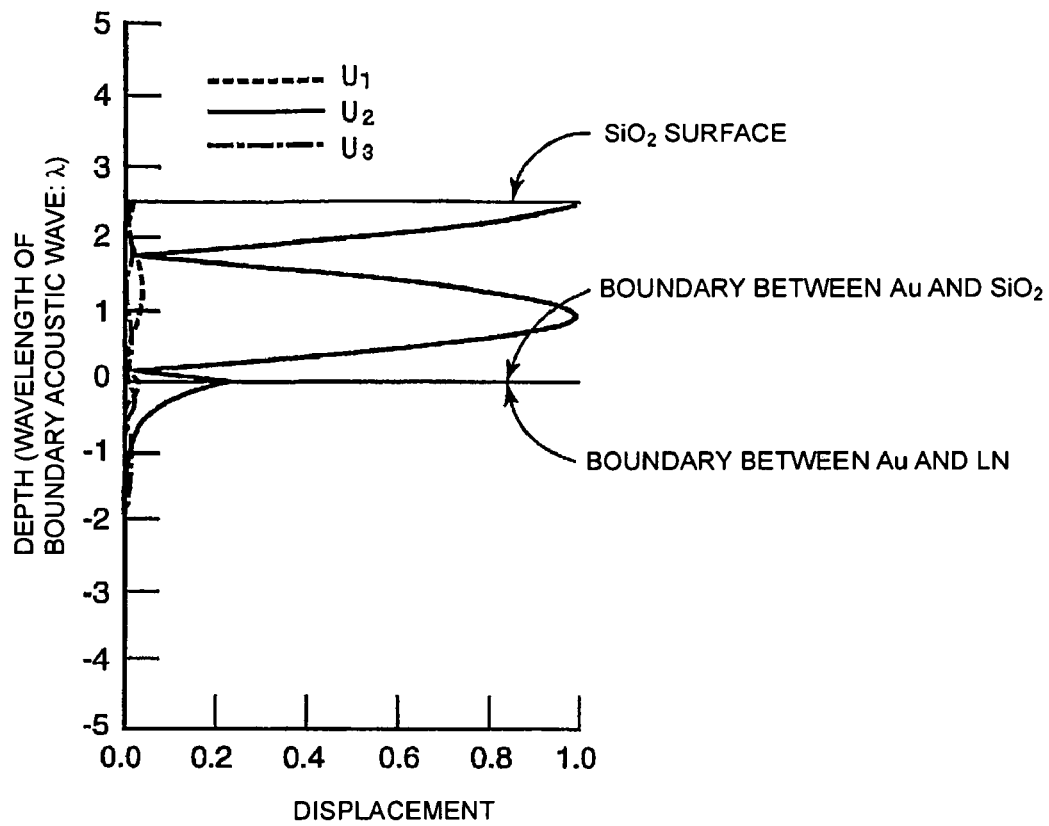
FIG. 4 is a graph showing one example of a displacement distribution of a spurious mode under the same conditions shown in FIG. 2.
Figure 5:
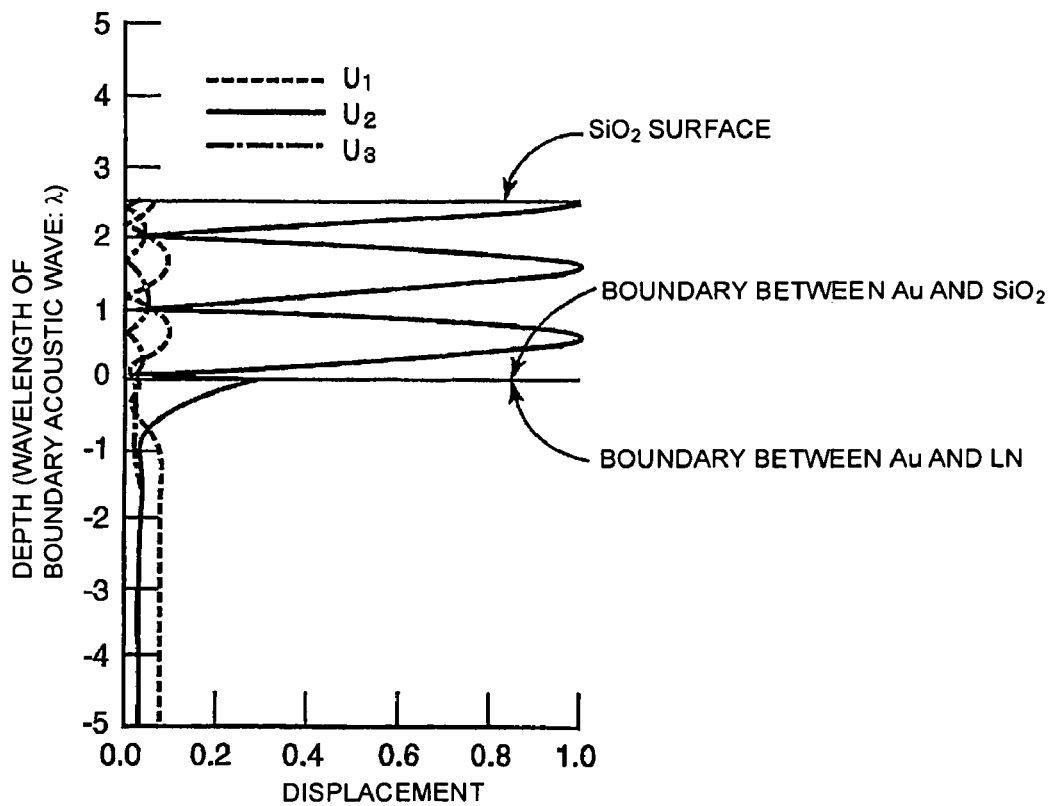
FIG. 5 is a graph showing one example of a displacement distribution of a spurious mode under the same conditions shown in FIG. 2.
Figure 6:
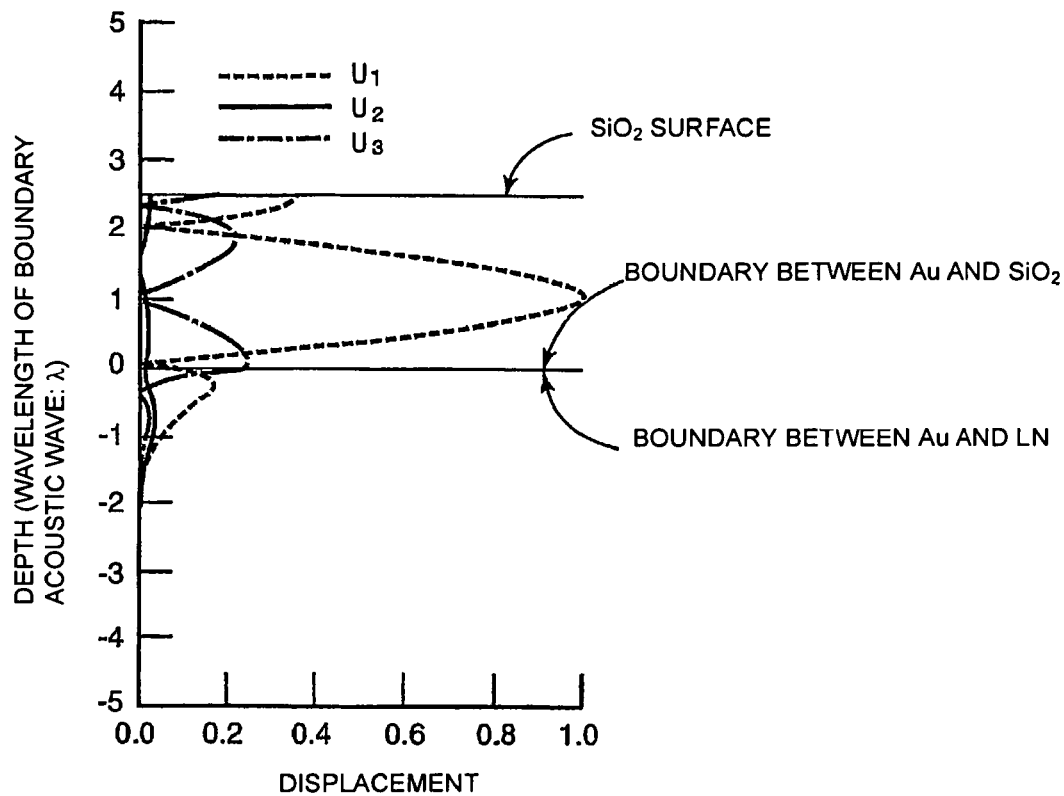
FIG. 6 is a graph showing one example of a displacement distribution of a spurious mode under the same conditions shown in FIG. 2.
Figure 7:
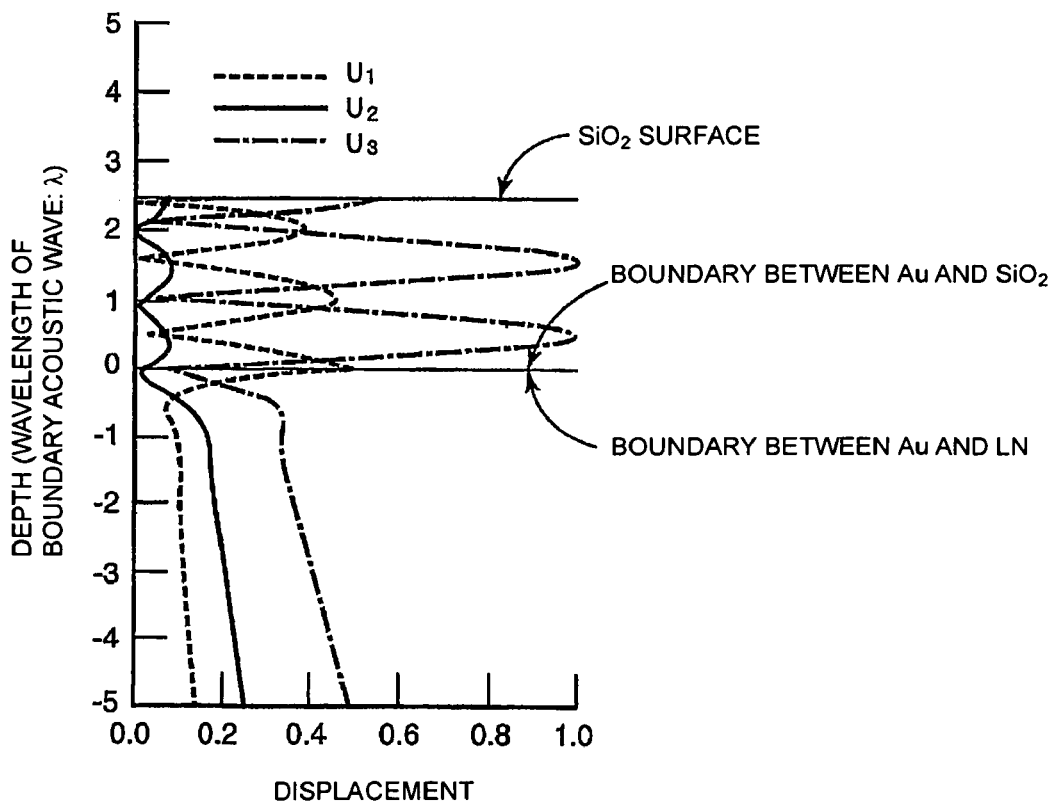
FIG. 7 is a graph showing one example of a displacement distribution of a spurious mode under the same conditions shown in FIG. 2.
Figure 8:
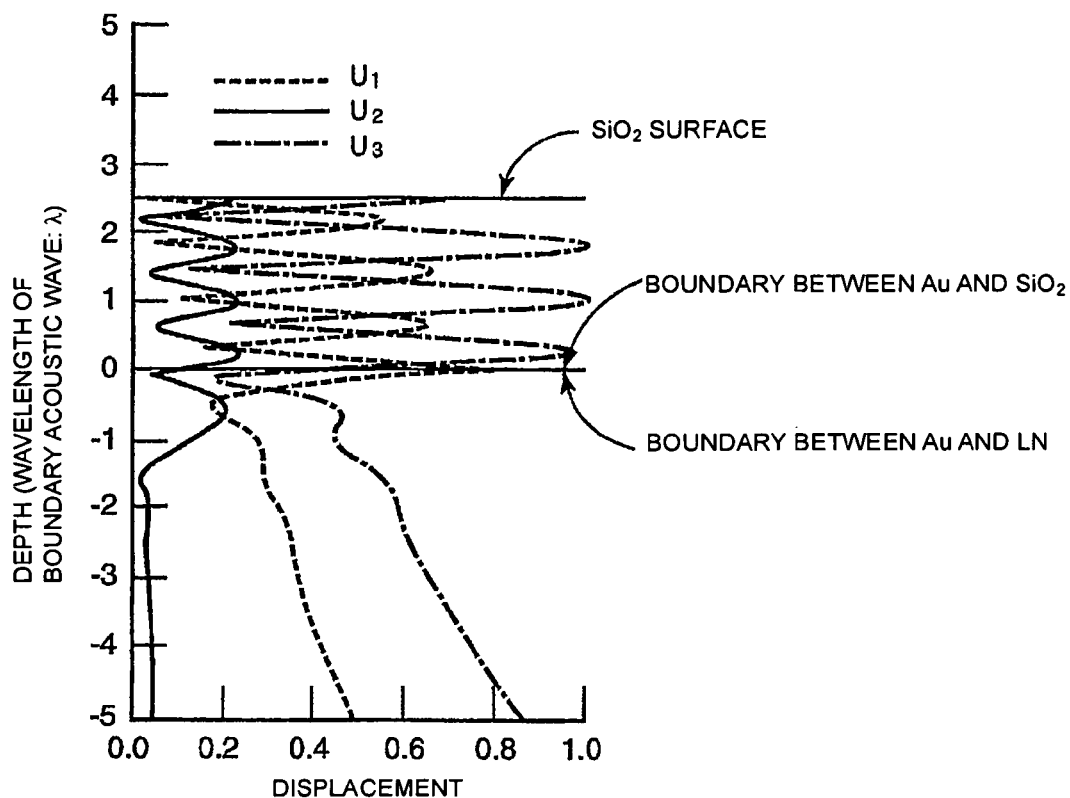
FIG. 8 is a graph showing one example of a displacement distribution of a spurious mode under the same conditions shown in FIG. 2.

FIG. 2 shows the displacement distribution of a main mode of a boundary acoustic wave when the thickness of the $SiO_2$ film is preferably about 2.5 λ, and FIGS. 3 to 8 show the displacement distributions of respective spurious modes under the same conditions as described above. In FIGS. 2 to 8, $U_1$, $U_2$, and $U_3$ represent a P wave component, an SH wave component, and an SV component, respectively, the horizontal axis indicates the displacement normalized by the maximum value, and the vertical axis indicates the depth direction (—side is the lower side).

As shown in FIG. 2, the main mode of the boundary acoustic wave is an SH type boundary acoustic wave which is primarily composed of an SH type component. In addition, from FIGS. 3 to 8, the spurious mode can be roughly categorized into two types of modes; one spurious mode is primarily composed of an SH wave component, and the other spurious mode is primarily composed of a P wave component and an SV wave component. The two types of spurious modes propagate along the upper surface of the $SiO_2$ film and along the boundary between the $SiO_2$ film and an IDT, which is made of Au. In addition, since a plurality of high-order modes of the above-described two types of spurious modes is generated, many spurious signals are generated, as shown in FIG. 17.

The boundary acoustic wave device according to preferred embodiments of the present invention was developed in order to suppress the spurious signals described above.

First Preferred Embodiment

Figure 1A:
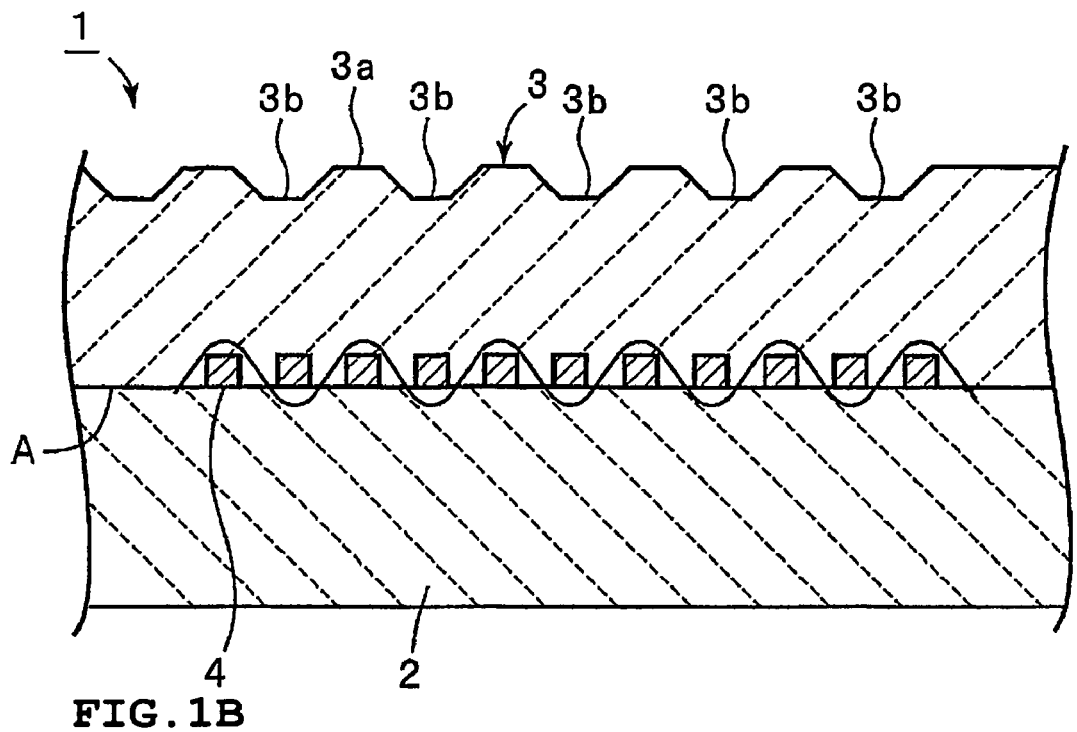
FIGS. 1(a) and 1(b) are a schematic front cross-sectional view showing a portion of a boundary acoustic wave device according to a first preferred embodiment of the present invention showing the appearance thereof, respectively.
Figure 1B:
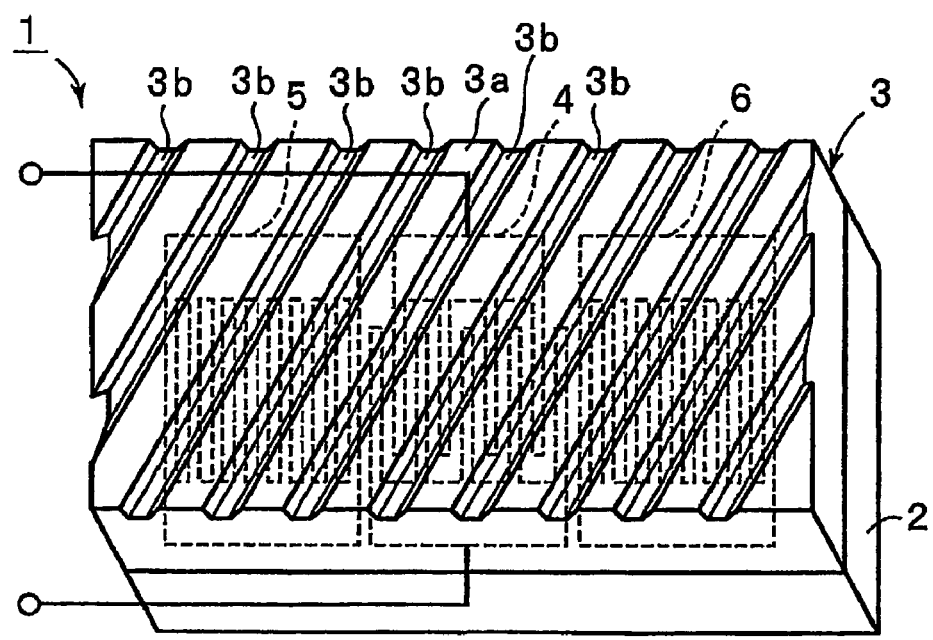

FIGS. 1(a) and 1(b) are a schematic front cross-sectional view and a schematic perspective view, respectively, illustrating a boundary acoustic wave device according to a first preferred embodiment of the present invention.

In a boundary acoustic wave device 1, a first medium layer 2 and a second medium layer 3 are laminated to each other. In this preferred embodiment, the first medium layer 2 is preferably a Y-cut X propagating single crystal $LiNbO_3$ substrate, and the second medium layer 3 is a $SiO_2$ film. Between the single crystal $LiNbO_3$ substrate 2 and the $SiO_2$ film 3, that is, at a boundary A between the first and the second medium layers, an IDT 4 defining an electroacoustic transducer is disposed. In FIG. 1(a), only a portion at which the IDT 4 is disposed is shown. However, as shown in FIG. 1(b), grating type reflectors 5 and 6 are provided at two sides of the IDT 4 in the direction along which a boundary acoustic wave propagates. A film of Au having a thickness of about 0.05 λ is formed on the single crystal $LiNbO_3$ substrate 2, so as to define the IDT 4 and the reflectors 5 and 6.

In addition, after the IDT 4 and the reflectors 5 and 6 are provided, a $SiO_2$ film having a thickness of about 3.0 λ is formed at a wafer heating temperature of 200° C. by RF magnetron sputtering, thereby forming the $SiO_2$ film 3.

The number of electrode finger pairs of the IDT 4, the cross width, and the duty ratio of the electrode finger forming the IDT 4 are preferably 50 pairs, about 30 λ, and about 0.6, respectively. The number of the electrode fingers of the reflectors 5 and 6 are preferably 50, and wavelengths λ of the IDT 4 and the reflectors 5 and 6 are preferably approximately the same. In addition, the distances between the centers of electrode fingers of the IDT and the reflectors are each preferably about 0.5λ.

In order to enhance the adhesion, on the upper and the lower sides of the Au film, thin Ti films having a thickness of approximately 0.0005 λ are preferably formed by deposition.

Next, in an upper surface 3a of the $SiO_2$ film 3, a plurality of grooves 3b having a depth of about 1 μm is formed by machining so as to be arranged at an angle of about 30° with respect to the direction in which the electrode fingers of the IDT 4 extend, such that the boundary acoustic wave device 1 of this preferred embodiment is obtained.

Figure 9:
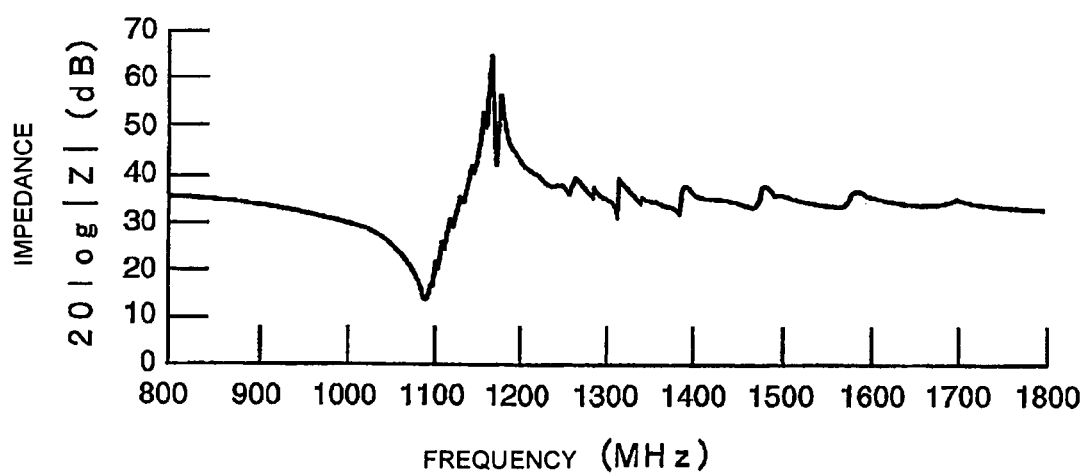
FIG. 9 is a graph showing impedance properties of the boundary acoustic wave device according to the second preferred embodiment of the present invention.

The impedance properties of the boundary acoustic wave device 1 thus obtained are shown in FIG. 9.

As shown in FIG. 9 as compared to the impedance properties of the boundary acoustic wave device 111 shown in FIG. 17, the spurious responses produced at a higher frequency side are suppressed in this preferred embodiment. For example, when a spurious signal generated at 1,300 MHz is represented by an impedance ratio, which is a ratio of the impedance at the resonance frequency to that at the antiresonance frequency, it is understood that the spurious signal is suppressed from about 22.9 dB to about 6.6 dB, that is, the spurious signal is suppressed to about one third.

In the boundary acoustic wave device 1 of this preferred embodiment, as described above, the grooves 3b are formed in the upper surface 3a of the $SiO_2$ film 3, which is located opposite to the boundary surface A, so as to define recess portions. It is believed that the formation of the recess portions scatters the spurious mode, and that the spurious signals are suppressed thereby as described above.

In view of the results obtained from the above-described boundary acoustic wave device 1, the inventors of the present invention performed further investigation in the depth of the recess portion and the shape thereof.

In the same manner as described above, the boundary acoustic wave device 1 was formed. However, when the recess portions were formed in the upper surface of the $SiO_2$ film 3, the grooves 3b were formed so as to be arranged at an angle of about 45° with respect to the direction in which the electrode fingers of the IDT 4 extend, the grooves 3b are obtained by forming a resist pattern on the $SiO_2$ film 3 using a photolithographic step, followed by wet etching with a diluted hydrogen fluoride solution. By changing in resist pattern and the etching conditions, the depth of the grooves 3b and the pitch therebetween were changed, such that a plurality of types of boundary acoustic wave devices was obtained.

The impedance properties of the plurality types of boundary acoustic wave devices thus obtained were measured, and in the same manner as described above, the impedance ratios were obtained.

Figure 10:
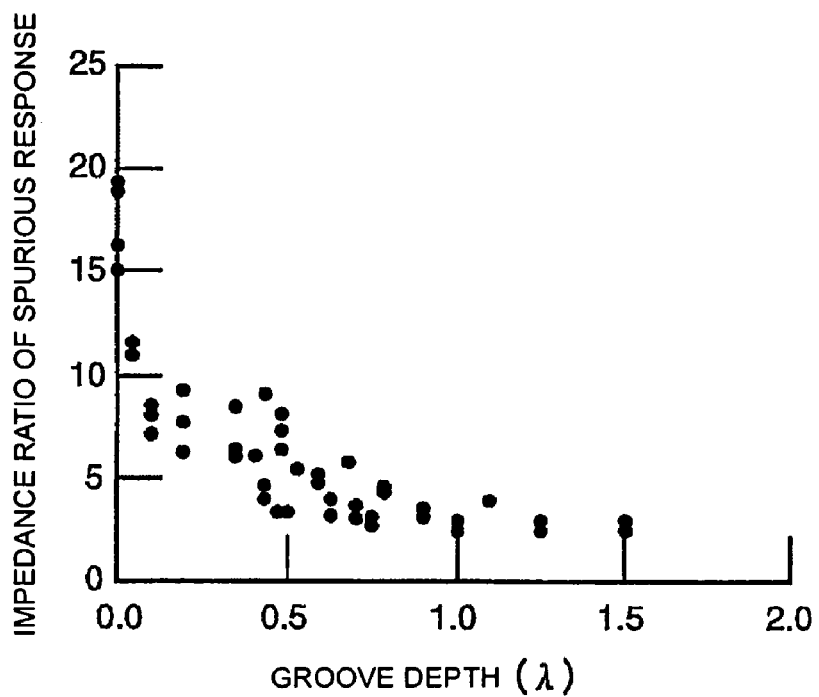
FIG. 10 is a graph showing the change in impedance ratio of a spurious mode obtained when the depth of grooves forming irregularities in the first preferred embodiment is changed.

FIG. 10 is a view showing the relationship between the impedance ratio of the spurious signals obtained as described above and the depth of the groove 3b, that is, the depth of the recess portion. As shown in FIG. 10, the impedance ratio of the spurious signals is improved to about 10 dB or less when the depth of recess portion is at least about 0.05 λ, and is further improved to about 5 dB or less when the depth of the recess portion is at least about 0.6 λ. Hence, the depth of the recess portion is preferably at least about 0.05 λ, and more preferably at least about 0.6λ.

Figure 11:
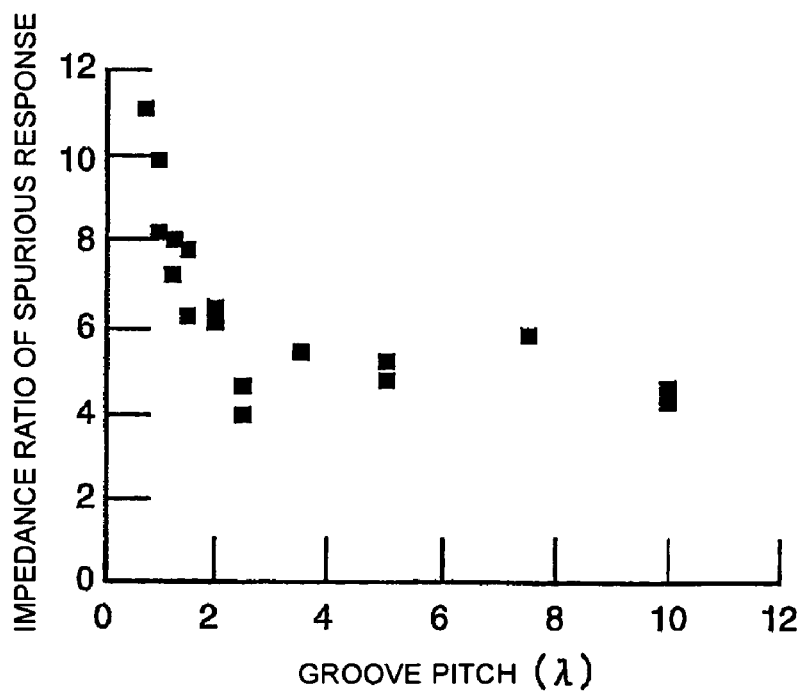
FIG. 11 is a graph showing the change in impedance ratio of a spurious mode obtained when the pitch between grooves forming irregularities is changed.

FIG. 11 is a view showing the relationship between the impedance ratio of the spurious signals and the pitch between the grooves 3b. As shown in FIG. 11, when the pitch between the grooves 3b is preferably at least about 1×, the impedance ratio of the spurious signals is improved to about 10 dB or less. Thus, preferably, the pitch between the grooves 3b is preferably at least about 1λ.

In addition, even when the angle between the groove 3b and the extending direction of the electrode finger of the IDT is preferably about 0° or about 90°, by forming the grooves 3b so as to have a depth of at least about 0.05 λ, the impedance ratio of the spurious signals is improved.

In this preferred embodiment, the grooves 3b are arranged to be substantially parallel to each other so as to form a desired angle with the extending direction of the electrode fingers. However, as shown in the schematic perspective view of FIG. 12, in addition to the grooves 3b, grooves 3c may be provided in the upper surface 3a of the SiO$_2$ film 3 so as to intersect the grooves 3b. In addition, when the depths of the grooves 3b and 3c are preferably at least about 0.05 λ, the impedance ratio of the spurious signals is improved as described above.

Figure 12:
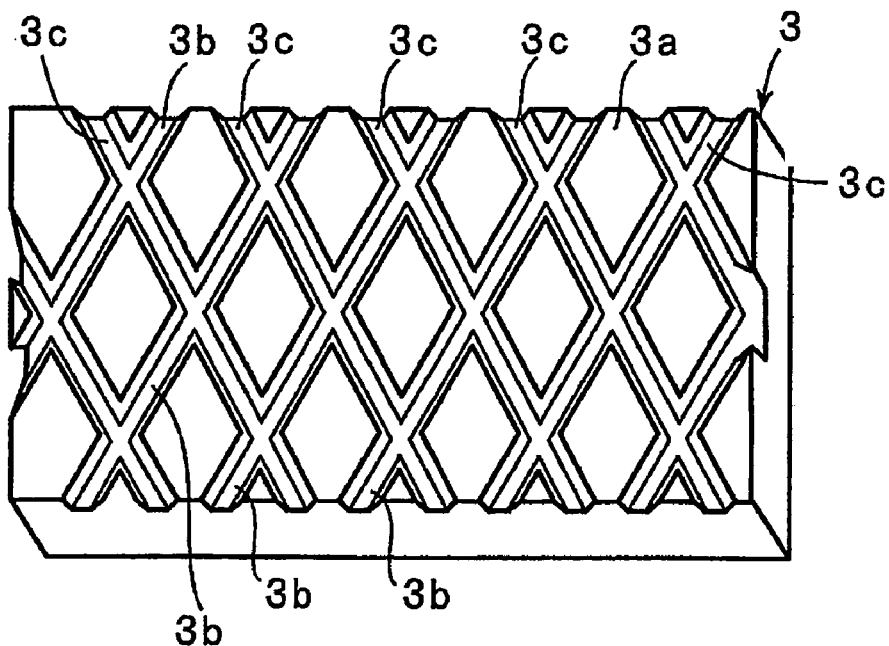
FIG. 12 is a schematic perspective view illustrating the structure of grooves of a modified example of the boundary acoustic wave device according to the first preferred embodiment of the present invention.

In FIGS. 1 and 12, in the SiO$_2$ film, that is, in the upper surface of the second medium, the grooves 3b or the grooves 3b and 3c are formed. However, instead of the linear grooves, curved grooves or grooves having another shape may also be formed. That is, the present invention is not limited to grooves which are disposed in parallel and which linearly extend.

In addition, in forming the recess portions, when the depth of the recess portion is preferably about λs/4×sin θs, where the spurious wavelength and the angle of the above spurious mode incident on the upper surface 3a of the SiO$_2$ film 3 are represented by λs and θs, respectively, the phase of the spurious signals reflected at the recess portion 3b is opposite to the phase reflected at the upper surface 3a, such that the above two phases counteract each other. Thus, the spurious signals received by the IDT 4 are more effectively suppressed.

In forming the recess portions described above, many grooves 3b are preferably formed. However, when at least one groove 3b is formed, the effect described above is also obtained. In addition, instead of the recess portions, protrusion portions in the form of dots may be provided, or the recess portions and the protrusion portions may be provided together.

Second Preferred Embodiment

A boundary acoustic wave device according to the second preferred embodiment has structure that is similar to that of the boundary acoustic wave device 1 according to the first preferred embodiment. Thus, description of the boundary acoustic wave device of the second preferred embodiment will be omitted, and whenever necessary, the description of the boundary acoustic wave device of the first preferred embodiment may be used instead. Points of the boundary acoustic wave device of the second preferred embodiment different from the first preferred embodiment are as follows: (1) grooves are not provided in the upper surface of the SiO$_2$ film 3, and (2) the thickness of the SiO$_2$ film 3 is preferably at least about 7λ.

That is, in the first preferred embodiment, the irregularities are provided by forming the grooves 3b or the grooves 3b and 3c, and as a result, the spurious signals are suppressed. In contrast to the first preferred embodiment, in the boundary acoustic wave device of the second preferred embodiment, since the thickness of the SiO$_2$ film 3 is preferably at least about 7 λ, the spurious signals are suppressed. This suppression will be described with reference to particular experimental examples.

The boundary acoustic wave device 1 was formed in the same manner as that of the experimental example of the first preferred embodiment. However, the irregularities were not provided in the surface of the SiO$_2$ film 3, and the thickness of the SiO$_2$ film 3 was changed. The relationship between the thicknesses of plural types of boundary acoustic wave devices thus obtained and the impedance ratio of the above spurious mode is shown in FIG. 13.

Figure 13:
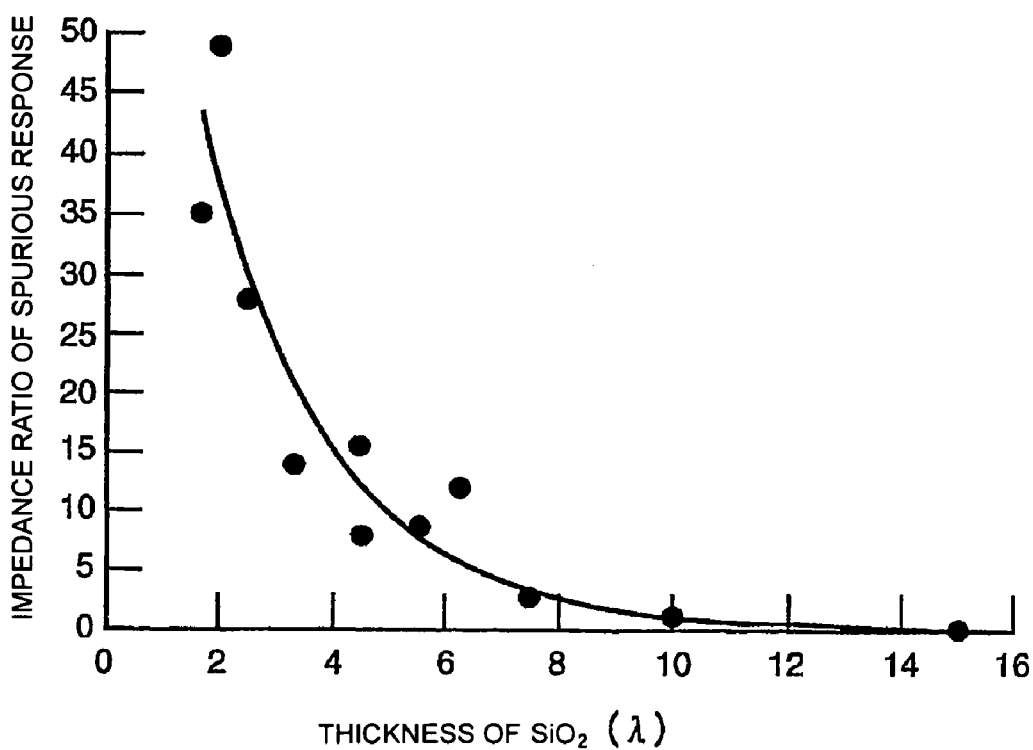
FIG. 13 is a graph illustrating a second preferred embodiment of the present invention showing the change in impedance ratio of a spurious mode obtained when the thickness of a $SiO_2$ film having a relatively low sound velocity is changed.

As shown in FIG. 13, when the thickness of the SiO$_2$ film is increased to at least about 7 λ, the impedance ratio of the spurious mode is decreased to about 5 dB or less.

In the boundary acoustic wave device of the second preferred embodiment, since the thickness of the SiO$_2$ film 3, which is the second medium layer having a relatively low sound velocity and in which an acoustic wave producing spurious signals is confined, is sufficiently increased, the spurious signals caused by the above-described acoustic wave are suppressed.

In addition, more preferably, in the boundary acoustic wave device 1 of the first preferred embodiment, that is, in the structure in which the recess portions and the protrusion portions are provided for the upper surface of the SiO$_2$ film, when the thickness of the SiO$_2$ film is increased as in the second preferred embodiment, the above-described spurious signals is more effectively suppressed. Thus, preferably, a boundary acoustic wave device including spurious suppression structures according to the first and the second preferred embodiments is provided.

Figure 14:
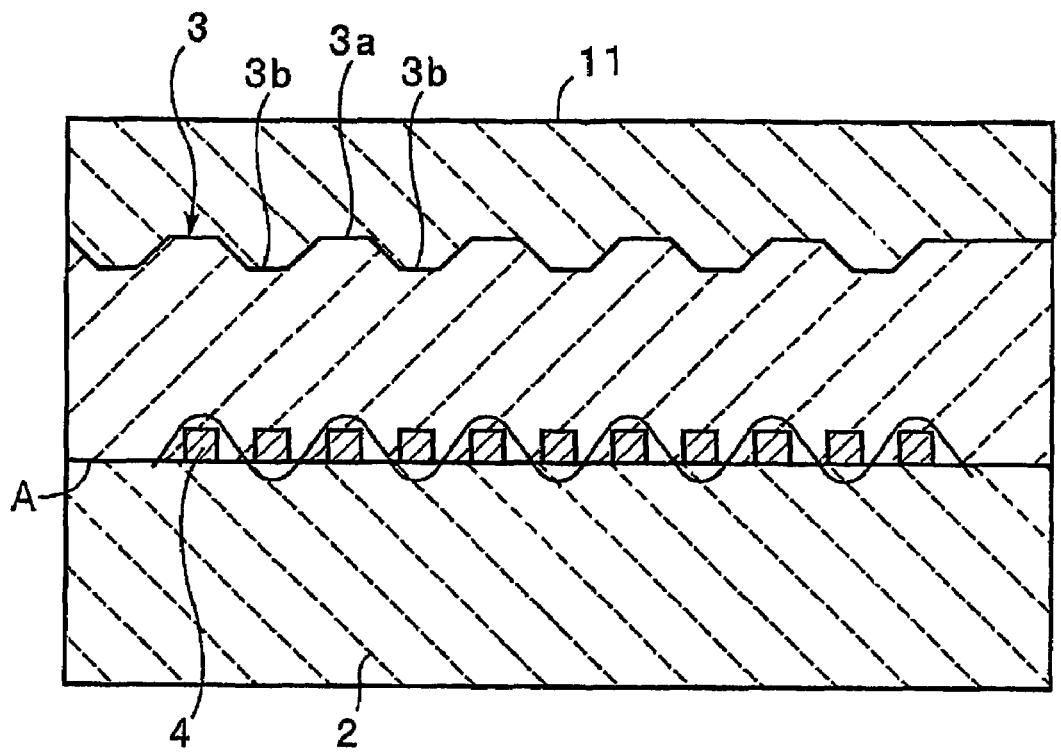
FIG. 14 is a schematic partial front cross-sectional view showing a portion of a boundary acoustic wave device of a modified example of the boundary acoustic wave device according to the first preferred embodiment of the present invention.
Figure 15:
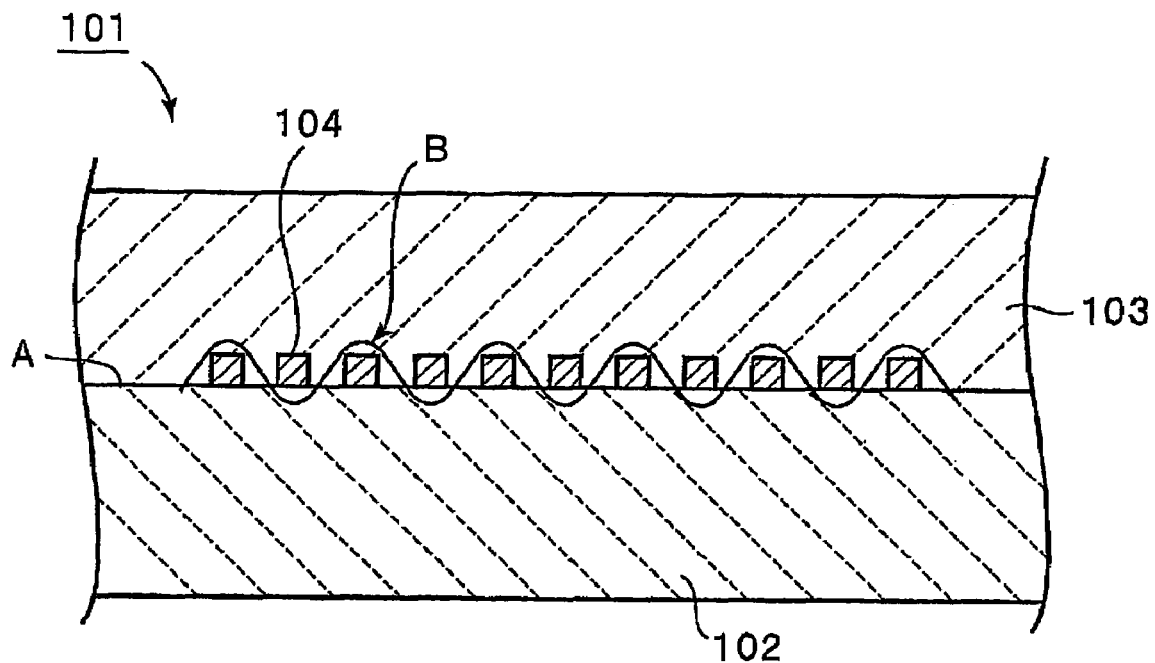
FIG. 15 is a schematic partially cut-away front cross-sectional view illustrating a conventional boundary acoustic wave device.

FIG. 14 is a schematic front cross-sectional view showing a modified example of a boundary acoustic wave device of the present invention.

In the boundary acoustic wave device 1 of the first preferred embodiment, the recess portions are formed by the formation of the grooves 3b in the upper surface of the SiO$_2$ film. However, in the case described above, an external layer material 11 may be formed so as to cover the above-described recess portions. When the exterior layer material 11 is formed, although a surface 11a of the exterior layer material 11 is flat, since the irregularities are provided in the upper surface 3a of the SiO$_2$ film 3 defining the second medium layer, the spurious signals are effectively suppressed as in the first preferred embodiment. As the exterior layer material 11, for example, a material such as AlN may be used.

The formation of the exterior layer material 11, improves the mechanical strength of the boundary acoustic wave device, and corrosive gases are prevented from penetrating the boundary wave device. That is, since the exterior layer material 11 provides a protective layer as described above, an insulating material, such as titanium oxide, aluminum nitride, or aluminum oxide, or a metal material such as Au, Al, or W may be used for the exterior layer material 11.

In addition, when the electroacoustic impedance of SiO$_2$ used as the second medium layer and that of the exterior layer material 11 are significantly different from each other, the formation of the exterior layer material 11, the spurious mode is confined and propagates between the boundary formed by the second medium layer and the exterior layer material 11 and the boundary along which the boundary acoustic wave propagates, as in a conventional boundary acoustic wave device. However, even in the case described above, when the recess portions and/or the protrusion portions are formed according to the first preferred embodiment, the spurious mode is suppressed.

Furthermore, in the present invention, between the first and the second medium layers, a third medium layer having a sound velocity less than that of the first and the second medium layers may be provided so as to be used as the boundary layer. In this case, IDT electrodes may be formed between the first and the third medium layers. As described above, in the structure having the third medium layer, a spurious mode is generated which propagates in the first or the second medium layer at the same time that the boundary acoustic wave is generated. However, the spurious mode can be suppressed by the formation of the second medium layer in the same manner as that of the first or the second preferred embodiment. Also in the case in which third and fourth medium layers are formed between the first and the second medium layers, when irregularities are formed at any one of the boundaries between the layers, the spurious mode is suppressed.

In the first and the second preferred embodiments, the IDT 4 and the reflectors 5 and 6 are formed of Au. However, an electrode material of the boundary acoustic wave device is not limited to Au, and for example, Ag, Cu, or Al may also be used. In addition, in order to improve the adhesion and electrical power resistance of the electrode, a thin layer of Ti, Cr, or NiCr may be provided on the electrode layer. In addition, besides resonators, the present invention may be applied to a transverse coupling type filter, a longitudinal coupling type filter including at least two IDTs and reflectors provided outside the IDTs, a ladder type filter, and a lattice type filter.

In addition, instead of $LiNbO_3$ and $SiO_2$, various piezoelectric materials may be used to form the first and the second medium layers, such as $LiTaO_3$, $Li_2B_4O_7$, quartz, and titanate zirconate lead-based ceramic, and various dielectric materials, such as glass and sapphire, may also be used.

Since the second medium layer having a relatively low sound velocity has a thickness of at least about 7 $\lambda$, as can be seen from the above-described experimental example, spurious signals which propagate between the boundary surface along which the boundary acoustic wave propagates and the surface of the second medium layer opposite to the boundary surface are effectively suppressed, and thus, a boundary acoustic wave device having superior resonance properties and filter properties are obtained.

Since the structure for scattering an acoustic wave is provided on at least one surface of the first and the second medium layers opposite to the boundary surface along which the boundary acoustic wave propagates, unwanted spurious signals caused by the acoustic wave are effectively suppressed, and as a result, superior resonance properties and filter properties are obtained.

Since the boundary acoustic wave devices utilize a boundary acoustic wave between the first and the second medium layers, a complicated package having a cavity portion is not required, and production is performed at a reduced cost. In addition, as compared to a surface acoustic wave device, miniaturization and reduction in weight are achieved, and thus, a compact acoustic wave device is provided in which high density mounting can be suitably performed.

When the structure for scattering an acoustic wave is provided on the second medium layer, the spurious mode in the second medium layer having a relatively low sound velocity, through which spurious signals are likely to propagate, is effectively suppressed.

When the structure for scattering an acoustic wave is defined by recess portions and/or protrusion portions provided on the surface of the medium layer opposite to the surface along which the boundary acoustic wave propagates, the recess portions and/or the protrusion portions reliably scatter the spurious mode.

When the depth of the irregularities described above is at least about 0.05 $\lambda$, or when the pitch between the recess portions and/or the protrusion portions is at least about 1 $\lambda$, the spurious signals are more effectively suppressed.

When the distance between the surface along which the boundary acoustic wave propagates and the surface on which the structure for scattering an acoustic wave is provided is about 7 $\lambda$ or less, since the thickness of the medium layer provided with the structure for scattering an acoustic wave is relatively thin, the spurious signals cannot be suppressed by the thickness of the medium layer. However, by providing the recess portions and/or the protrusion portions, the spurious signals are effectively suppressed.

When the exterior layer material is further provided so as to cover the recess portions and/or the protrusion portions, the exterior material layer increases the mechanical strength of the boundary acoustic wave device and/or improves the electrical power resistance.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the present invention which fall within the true spirit and scope of the invention.

The invention claimed is:

1. A boundary acoustic wave device comprising:
a first medium layer and a second medium layer arranged such that a boundary acoustic wave propagates along a boundary between the first medium layer and the second medium layer; wherein
a sound velocity of the second medium layer is lower than a sound velocity of the first medium layer, and a thickness of the second medium layer is at least about 7 $\lambda$, where the wavelength of the boundary acoustic wave is represented by $\lambda$.

2. The boundary acoustic wave device according to claim 1, wherein an electroacoustic transducer is arranged to generate the boundary acoustic wave and disposed between the first medium layer and the second medium layer.

3. The boundary acoustic wave device according to claim 2, wherein a reflector is provided at the boundary between the first medium layer and the second medium layer.

4. The boundary acoustic wave device according to claim 1, wherein a third medium layer having a sound velocity less than the sound velocity of the first medium layer and the second medium layer is provided between the first medium layer and the second medium layer and defines a boundary layer along which the boundary acoustic wave propagates.

5. A boundary acoustic wave device comprising:
a first medium layer and a second medium layer arranged such that a boundary acoustic wave propagates along a boundary between the first medium layer and the second medium layer; wherein
a wave scattering structure is arranged to scatter an acoustic wave and disposed on at least one surface of the first and second medium layers at a side opposite to a boundary surface therebetween; and a sound velocity of the second medium layer is less that a sound velocity of the first medium layer, and the wave scattering structure is provided on the second medium layer.

6. The boundary acoustic wave device according to claim 5, wherein the wave scattering structure includes at least one recess portion provided on the at least one surface of the first and second medium layers at the side opposite to the boundary surface.

7. The boundary acoustic wave device according to claim 6, wherein a depth of the at least one recess portion is at least about 0.05 $\lambda$, wherein the wavelength of the boundary acoustic wave is represented by $\lambda$.

8. The boundary acoustic wave device according to claim 6, wherein the at least one recess portion includes a plurality of recess portions, and a pitch between each of the plurality of recess portions is at least about 1 $\lambda$, where the wavelength of the boundary acoustic wave is represented by $\lambda$.

9. The boundary acoustic wave device according to claim 6, wherein an exterior layer material is provided on the surface of the medium layer on which the at least one recess portion is provided.

10. The boundary acoustic wave device according to claim 5, wherein the wave scattering structure includes at least one protrusion portion provided on the at least one surface of the first and second medium layers at the side opposite to the boundary surface.

11. The boundary acoustic wave device according to claim 10, wherein a height of the at least one protrusion portion is at least about 0.05 $\lambda$, where the wavelength of the boundary acoustic wave is represented by $\lambda$.

12. The boundary acoustic wave device according to claim 10, wherein the at least one protrusion portion includes a plurality of protrusion portions, and a pitch between each of the plurality of protrusion portions is at least about 1 $\lambda$, where the wavelength of the boundary acoustic wave is represented by $\lambda$.

13. The boundary acoustic wave device according to claim 10, wherein an exterior layer material is provided on the surface of the medium layer on which at least one protrusion portion is provided.

14. The boundary acoustic wave device according to claim 5, wherein a thickness of the medium layer on which the wave scattering structure is provided is about 7 $\lambda$ or less, where the wavelength of the boundary acoustic wave is represented by $\lambda$, and the thickness of the medium layer is the distance between the boundary surface and the surface opposite thereto.

15. The boundary acoustic wave device according to claim 5, wherein the first medium layer is made of a piezoelectric substrate including Li, the second medium layer is made of $SiO_2$, and at least one recess portion is provided on a surface of the second medium layer made of $SiO_2$.

16. The boundary acoustic wave device according to claim 5, wherein the first medium layer is made of a piezoelectric substrate including Li, the second medium layer is made of $SiO_2$, and at least one protrusion portion is provided on a surface of the second medium layer made of $SiO_2$.

17. The boundary acoustic wave device according to claim 5, wherein an electroacoustic transducer is arranged to generate boundary acoustic wave and is disposed between the first medium layer and the second medium layer.

18. The boundary acoustic wave device according to claim 17, wherein a reflector is provided at the boundary between the first medium layer and the second medium layer.

19. The boundary acoustic wave device according to claim 5, wherein a third medium layer having a sound velocity less than the sound velocity of the first medium layer and the second medium layer is provided between the first medium layer and the second medium layer and defines a boundary layer along which the boundary acoustic wave propagates.

* * * * *